United States Patent [19]

Guo

[11] Patent Number: 5,019,726
[45] Date of Patent: May 28, 1991

[54] BICMOS ECL-TO-CMOS CONVERSION CIRCUIT

[75] Inventor: Tzen-Wen Guo, Danville, Calif.

[73] Assignee: Advanced Micro Devices, Inc., Sunnyvale, Calif.

[21] Appl. No.: 420,985

[22] Filed: Oct. 13, 1989

[51] Int. Cl.⁵ .......................................... H03K 19/01
[52] U.S. Cl. .................................... 307/446; 307/443; 307/570
[58] Field of Search ............... 307/443, 446, 451, 455, 307/475, 570

[56] References Cited

U.S. PATENT DOCUMENTS

| | | | |
|---|---|---|---|
| 4,695,750 | 9/1987 | Hara et al. | 307/446 X |
| 4,697,109 | 9/1987 | Honma et al. | 307/446 X |
| 4,794,317 | 12/1988 | van Tran | 307/475 |
| 4,849,660 | 7/1989 | Hayashi et al. | 307/475 |
| 4,855,624 | 8/1989 | Kertis et al. | 307/446 X |

Primary Examiner—David Hudspeth
Attorney, Agent, or Firm—Davis Chin

[57] ABSTRACT

A bipolar/CMOS ECL-to-CMOS conversion circuit for receiving ECL differential input signals and for converting the ECL input signals to CMOS complementary output signals, includes, a first output stage (20), a second output signal (22), a first base drive circuit (24), a second base drive circuit (26), a third base drive circuit (28), and a fourth base drive circuit (30). The first and second output stages are formed of bipolar transistors, and the first through fourth base drive circuits ar formed of CMOS transistors. The bipolar transistors and CMOS transistors are merged in a common semiconductor substrate in order to form the conversion circuit which has high current drive capabilities and low propagation delay regardless of variations in temperature and process corners.

10 Claims, 1 Drawing Sheet

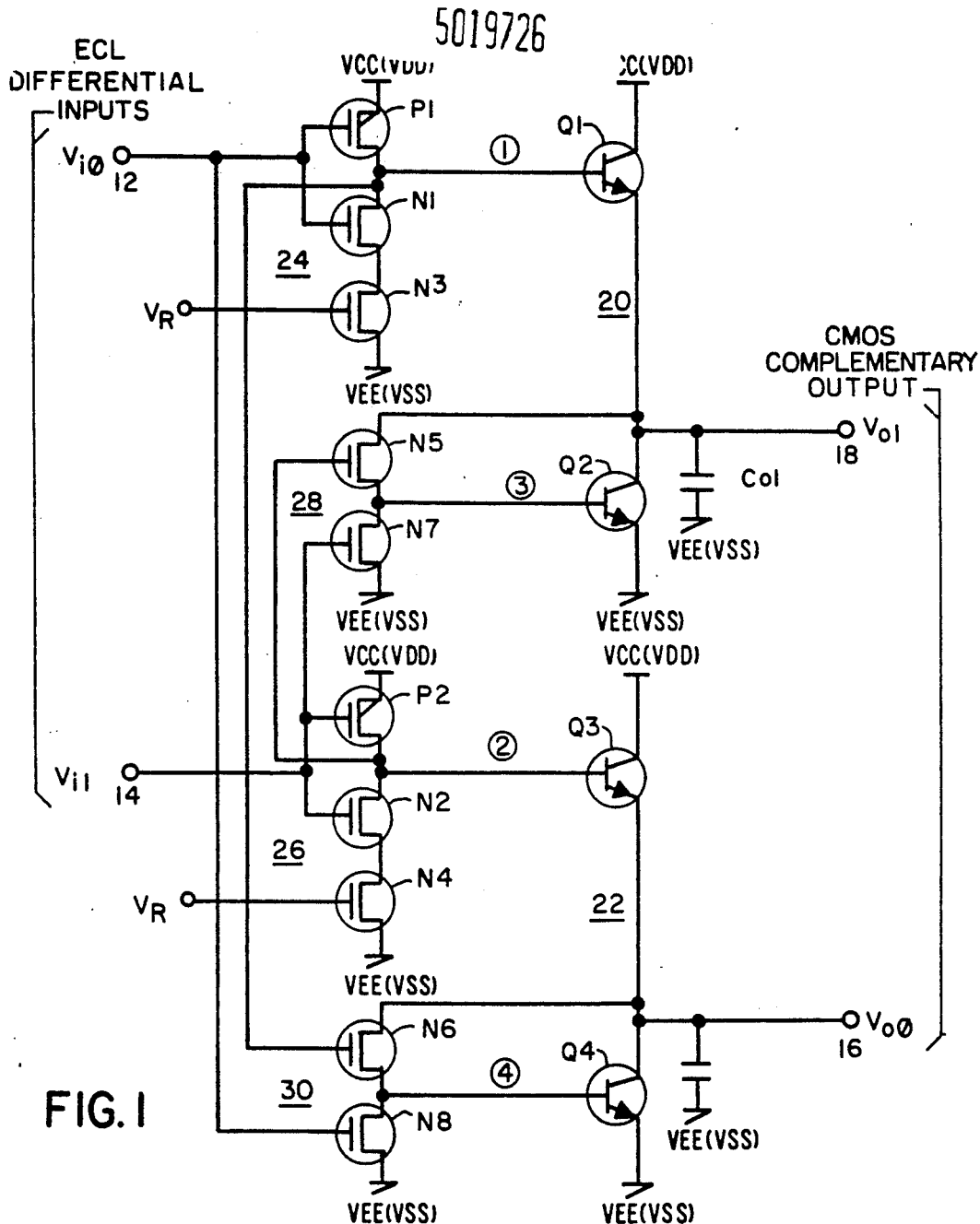
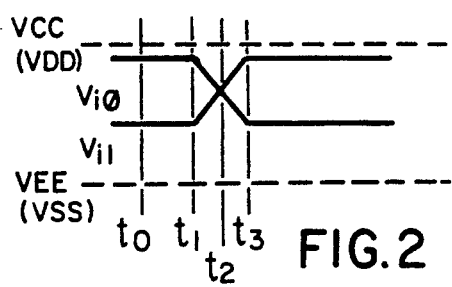
FIG. 2
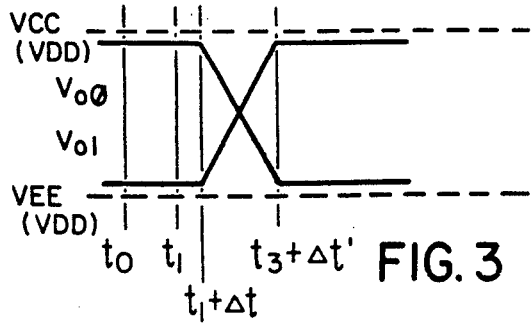
FIG. 3
FIG. 1

BICMOS ECL-TO-CMOS CONVERSION CIRCUIT

BACKGROUND OF THE INVENTION

This invention relates generally to interface or conversion circuits and more particularly, it relates to a BICMOS (bipolar/CMOS mixed type) ECL-to-CMOS conversion circuit having high current drive capability and low propagation delay for receiving ECL input level signals and for producing output signals which are CMOS compatible.

CMOS or TTL logic levels have larger voltage swings (CMOS level has a voltage swing of approximately 5.0 volts and TTL level has a voltage swing of approximately 3.0 volts) so that they are easier to meet the required levels. This means that CMOS or TTL logic circuits can be fabricated at lower cost. However, they become inherently slow and noisy due to the fact of the higher voltage swings. On the other hand, ECL logic levels has a smaller voltage swing (about 0.8 volts) so that it is more difficult to meet the required levels. It normally requires good bipolar transistors to achieve the required levels. As a result, this increases manufacturing costs. Also, ECL logic inherently controls signals by switching constant currents so that it has high power consumption to maintain the high speed. Of course, ECL logic provides higher speed without making noise by running high currents.

Therefore, it would be desirable to place both ECL and CMOS/TTL levels in a single semiconductor chip or single system in order to gain better performance with lower cost. For example, memories using BICMOS technology commonly use CMOS level for memory core, decoders and control logic units to obtain higher density, higher yield, higher soft-error immunity, and lower power consumption. In contrast, ECL level is used for input and output circuits to achieve higher speed with lower noise for inter-chip interface. Thus, translation circuits to convert data between ECL levels and CMOS or TTL levels become desirable.

Traditionally, MOS translators are slow just as are common MOS circuits. On the other hand, bipolar translators suffer from the disadvantage of high power consumption in order to obtain high speed and they often require PNP-type bipolar transistors and/or Schottky diodes which further complicate the processes in fabricating the translators. Therefore, it would be highly desirable to merge or combine the CMOS and bipolar technologies together so as to make a BICMOS translator which has all of the advantages of the CMOS and bipolar technologies but yet have none of their disadvantages.

SUMMARY OF THE INVENTION

Accordingly, it is a general object of the present invention to provide a bipolar/CMOS ECL-to-CMOS conversion circuit which is relatively simple and economical to manufacture and assemble, but yet overcomes the disadvantages of the prior art conversion circuits.

It is an object of the present invention to provide a bipolar/CMOS ECL-to-CMOS conversion circuit which has high current drive capability and low propagation delay.

It is another object of the present invention to provide a bipolar/CMOS ECL-to-CMOS conversion circuit which has fast switching speeds regardless of variations in temperature and process corners.

It is still another object of the present invention to provide a bipolar/CMOS ECL-to-CMOS conversion circuit for receiving ECL differential input level signals and for generating complementary output signals that are CMOS compatible.

In accordance with these aims and objectives, the present invention is concerned with the provision of a bipolar/CMOS ECL-to-CMOS conversion circuit for receiving ECL differential input signals and for converting the ECL input signals to CMOS complementary output signals. The conversion circuit includes a first output stage, a second output stage, a first base drive circuit, a second base drive circuit, a third base drive circuit, and a fourth base drive circuit. The first output stage is formed of a first bipolar transistor and a second bipolar transistor. The first bipolar transistor has its collector connected to an upper supply potential and its emitter connected to the collector of the second bipolar transistor. The second bipolar transistor has its collector connected also to a first output terminal for generating one of the CMOS complementary output signals and its emitter connected to a lower supply potential. The second output stage is formed of a third bipolar transistor and a fourth bipolar transistor. The third bipolar transistor has its collector connected to the upper supply potential and its emitter connected to the collector of the fourth bipolar transistor. The fourth bipolar transistor has its collector connected also to a second output signal for generating the other one of the CMOS complementary output signals and its emitter connected to the lower supply potential.

The first base drive circuit is responsive to one of the ECL differential input signals for generating a first control signal connected to the base of the first bipolar transistor. The second base drive circuit is responsive to the other one of the ECL differential input signals for generating a second control signal connected to the base of the third bipolar transistor. The third base drive circuit is responsive to the second control signal and the other one of the ECL differential input signals for generating a third control signal connected to the base of the second bipolar transistor. The fourth base drive circuit is responsive to the first control signal and the said one of the ECL differential input signals for generating a fourth control signal connected to the base of the fourth bipolar transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a schematic circuit diagram of a bipolar/CMOS ECL-to-CMOS conversion circuit of the present invention;

FIG. 2 shows waveforms of the ECL differential input signals; and

FIG. 3 shows waveforms of the CMOS complementary output signals.

DESCRIPTION OF THE PREFERRED EMBODIMENT

Referring now in detail to the drawings, there is illustrated in FIG. 1 a schematic circuit diagram of a BIC- MOS (bipolar/CMOS) ECL-to-CMOS conversion circuit 10 of the present invention for receiving ECL differential input signals and for converting the ECL input signals to CMOS complementary output signals. The conversion circuit 10 has first and second input terminals 12 and 14 for receiving the respective ECL differential input signals $V_{i0}$ and $V_{i1}$ which are referenced to an upper supply potential at a supply voltage or potential VCC (VDD). Typically, the upper supply potential VCC is 0 volts for conventional ECL logic and the upper supply potential VDD is approximately +5.0 volts ±10%, for conventional TTL logic. Thus, the input ECL signal levels are roughly between VCC (VDD) −0.8 volts (high) and VCC (VDD) −1.6 volts (low); however, the precise values are specified as a function of temperature and supply voltage.

The conversion circuit 10 has first and second output terminals 16 and 18 for producing the respective CMOS complementary output signals $V_{o0}$ and $V_{o1}$ which have a full voltage swing from a lower supply potential to the upper supply potential. Therefore, the output CMOS signal levels are between VCC (VDD) and VEE (VSS) where VCC is the upper supply potential and VEE is the lower supply potential for the conventional ECL logic, and where VDD is the upper supply potential and VSS is the lower supply potential for conventional TTL logic. Typically, the lower supply potential VEE is −5.0 volts ±10% and VSS is 0 volts. The conversion circuit 10 functions to translate the ECL logic levels received at the input terminals 12, 14 to CMOS compatible logic signals at the corresponding output terminal 16, 18 with increased current drive capability and thus shorter propagation delay, but yet being substantially independent of variations in temperature and process corners.

The conversion circuit 10 includes a first bipolar output stage 20 and a second bipolar output stage 22. The first output stage 20 is formed of an NPN-type, pull-up bipolar transistor Q1 and an NPN-type, pull-down bipolar transistor Q2. The pull-up bipolar transistor Q1 has its collector connected to the upper supply potential VCC (VDD) and its emitter connected to the output terminal 18. The pull-down bipolar transistor Q2 has its collector connected to the emitter of the pull-up bipolar transistor Q1 and also to the output terminal 18. The emitter of the pull-down transistor Q2 is connected to the lower supply potential VEE (VSS). A capacitor C01 representing a capacitive load has its one end tied to the output terminal 18 and its other end tied to the lower supply potential VEE (VSS).

Similarly, the second output stage 22 is formed of an NPN-type, pull-up bipolar transistor Q3 and an NPN-type, pull-down bipolar transistor Q4. The pull-up bipolar transistor Q3 has its collector connected to the upper supply potential and its emitter connected to the output terminal 16. The bipolar pull-down transistor Q4 has its collector connected to the emitter of the pull-up transistor Q3 and to the output terminal 16. The emitter of the pull-down transistor Q4 is connected to the lower supply potential VEE (VSS). A capacitor C00 representing a capacitive load has its one end tied to the output terminal 16 and its other end tied to the lower supply potential VEE (VSS). The bipolar transistors have the advantage over CMOS transistors in that the former have the ability of providing higher drive currents used for driving capacitive output loads.

The conversion circuit 10 further includes a first CMOS base drive circuit 24 for the pull-up transistor Q1 in the first output stage 20, a second CMOS base drive circuit 26 for the pull-up transistor Q3 in the second output stage 22, a third CMOS base drive circuit 28 for the pull-down transistor Q2 in the first output stage, and a fourth CMOS base drive circuit 30 for the pull-down transistor Q4 in the second output stage. The first CMOS base drive circuit 24 is formed of a P-channel MOS transistor P1, an N-channel MOS transistor N1, and an N-channel MOS transistor N3. The P-channel MOS transistor P1 has its source connected to the upper supply potential VCC (VDD), its gate connected to the gate of the N-channel MOS transistor N1, and its drain connected to the drain of the transistor N1. The common gates of the transistors P1 and N1 are connected to the input terminal 12 for receiving one of the ECL differential input signals $V_{i0}$, and the common drains of the transistors P1 and N1 provide a first control signal which is connected to the base of the pull-up bipolar transistor Q1. The N-channel MOS transistor N3 has its drain connected to the source of the transistor N1, its gate connected to a CMOS gate-controlling voltage $V_R$, and its source connected to the lower supply potential VEE (VSS). The gate-controlling voltage $V_R$ may be generated from a regulator circuit of the type described in copending application Ser. No. 421,230 filed on Oct. 12, 1989, now U.S. Pat. No. 4,943,737 issued on July 24, 1990 which is assigned to the same assignee as this invention. The transistor N3 serves as a regulated current source and is always rendered conductive.

Similarly, the second CMOS base drive circuit 26 is formed of a P-channel MOS transistor P2, an N-channel MOS transistor N2, and an N-channel MOS transistor N4. The P-channel MOS transistor P2 has its source connected to the upper supply potential VCC (VDD), its gate connected to the gate of the N-channel MOS transistor N2, and its drain connected to the drain of the transistor N2. The common gates of the transistors P2 and N2 are connected to the input terminal 14 for receiving the other one of the ECL differential input signals $V_{i1}$, and the common drains of the transistors P2 and N2 provide a second control signal connected to the base of the pull-up bipolar transistor Q3. The N-channel MOS transistor N4 has its drain connected to the source of the transistor N2, its gate connected to the CMOS gate-controlling voltage $V_R$, and its source connected to the lower supply potential VEE (VSS). Again, the transistor N3 serves as a regulated current source and is always rendered conductive.

The third CMOS base drive circuit 28 consists of N-channel MOS transistors N5 and N7. The transistor N5 has its drain connected to the collector of the bipolar transistor Q2, its gate connected to the second control signal at the common drains of the transistors P2, N2, and its source connected to the drain of the transistor N7. The transistor N7 has its drain also connected to the base of the pull-down bipolar transistor Q2 to provide a third control signal, its gate connected to the common gates of the transistors P2, N2, and its source connected to the lower supply potential VEE (VSS).

The fourth CMOS base drive circuit 30 consists of N-channel MOS transistors N6 and N8. In a similar manner, the transistor N6 has its drain connected to the collector of the bipolar transistor Q4, its gate connected to the common drains of the transistors P1, N1, and its source connected to the drain of the transistor N8. The transistor N8 has its drain also connected to the base of the pull-down bipolar transistor Q4 to provide a fourth control signal, its gate connected to the common gates of the transistors P1, N1, and its source connected to the lower supply potential VEE (VSS). It should be understood to those skilled in the art that the conversion circuit device 10 is formed on a single silicon chip of a monolithic intergrated circuit.

The operation of the conversion circuit 10 will be explained with reference to the waveform diagrams depicted in FIGS. 2 and 3 which are useful in the understanding of this invention constructed as described above. It will be initially assumed that the ECL input signal $V_{i0}$ is at a high or "1" state and that the ECL input signal $V_{i1}$ is at a low or "0" state at time $t_0$, as illustrated in FIG. 2. As a result, the P-channel MOS transistor P1 will be rendered non-conductive and the N-channel MOS transistors N1 and N3 will be in the fully conductive states. Thus, there will be no drive current to the base (node 1) of the bipolar transistor Q1, rendering the same to be off. Also, the P-channel MOS transistor P2 will be in the conductive state and the N-channel MOS transistor N2 will be rendered less conductive. With the transistor P2 being conductive and being designed to be much stronger than the series connection of the transistors N2 and N4, this causes the base (node 2) of the bipolar transistor Q3 to be at a high state.

Consequently, the transistor N5 will be rendered fully conductive. It will be noted that the transistor N7 is less conductive. Since the transistor N5 is designed to be much stronger than the transistor N7, there is provided a low resistance path between the base (node 3) of the bipolar transistor Q2 and the output terminal 18 (node 5). With the transistor N5 being conductive, there is provided drive current to the base of the transistor Q2 so as to turn on the same for pulling down the CMOS output voltage $V_{o1}$ on the node 5. This output voltage $V_{o1}$ in the low state will be equal to approximately 0.4 volts above the lower supply potential VEE (VSS).

Since the node 1 is at a low state and the ECL input signal $V_{i0}$ is at a high state, the N-channel MOS transistor N6 will be rendered non-conductive and the transistor N8 will be in the fully conductive state. Therefore, there will be no drive current to the base (node 4) of the bipolar transistor Q4, thereby rendering the same to be off. Further, since the node 2 is at a high state and the transistor Q4 is turned off, there is provided drive current to the base of the bipolar transistor Q3 so as to turn on the same for pulling up the CMOS output voltage $V_{o0}$ on the node 6. This output voltage $V_{o0}$ in the high state will be equal to approximately 0.4 volts below the upper supply potential VCC (VDD). The corresponding CMOS complementary output voltage $V_{o0}$ and $V_{o1}$ at the time $t_o$ are shown in FIG. 3.

As can be seen from the times $t_1$ to $t_3$ in FIG. 2, the ECL input signal $V_{i0}$ is making a high-to-low transition and the ECL input signal $V_{i1}$ is making a low-to-high transition. This will cause the transistor P1 to begin turning on and the transistor P2 to begin turning off. Also, the transistors N1 and N8 are rendered to be less heavily conductive, and the transistors N2 and N7 are rendered to be more heavily conductive. Thus, the voltage on the node 1 will be rising while the voltage on the node 2 will be dropping. As a result, the transistor N6 will be rendered conductive and the transistor N5 will be rendered non-conductive.

With the transistor N6 being turned on and the transistor N8 being less heavily conductive, there is provided a strong drive current to the base of the bipolar transistor Q4 from the node 6. Consequently, the CMOS complementary output voltage $V_{o0}$ at the node 6 will make a high-to-low transition while the voltage on the node 2 has already been at the low state. With the transistor N5 being turned off and the transistor N7 being rendered more heavily conductive, there will be no drive current to the base of the transistor Q2. Therefore, the CMOS output voltage $V_{o1}$ at the node 5 will make a low-to-high transition since the bipolar transistor Q1, which has drive current on its base at the node 1, serves to pull up the node 5. The corresponding CMOS complementary output voltage $V_{o0}$ and $V_{o1}$ between the times $t_1+\Delta t$ and $t_3+\Delta t$ are illustrated in FIG. 3.

The conversion circuit 10 of the present invention has a minimum number of transistor count in the signal path so as to reduce propagation delay. For example, when the ECL input signal $V_{i0}$ at the input terminal 12 makes a high-to-low transition, there are only two transistor delays (transistors P1 and Q1) before pulling up of the capacitive load CO1 so as to cause a low-to-high transition at the output terminal 18. Further, there are only three transistor delays (transistors P1, N6 and Q4) before pulling down of the capacitive load COO so as to cause a high-to-low transition at the output terminal 16. When the ECL input signal $V_{i1}$ at the input terminal 14 makes a low-to-high transition, there is only one transistor delay (transistor P2) before pulling down of the node 2.

When the node 2 is being pulled down, the relatively low capacitive node 2 is isolated from the high capacitive load COO by the bipolar transistor Q3. By designing the relative sizes of the CMOS transistors, the voltage at the node 2 can be made to quickly turn off the pull-up transistor Q3 before the pull-down transistor Q4 is turned on. As a consequence, the transient current through the bipolar transistors Q3 and Q4 can be eliminated. Further, the bipolar transistor Q3 will not be clamping the node 6 which would slow down the fast turn-on of the pull-down transistor Q4. Since the node 2 is going down fast, this causes the transistor N5 to quickly turn off so as to render the transistor Q2 to be non-conductive. Therefore, the transistor Q2 will not be clamping the node 1 which would slow down the fast turn-on of the pull-up transistor Q1. Again, the transient current through the bipolar transistors Q1 and Q2 can be avoided.

It will be noted that since the gate electrodes of the transistors N7 and N8 are controlled by ECL input levels, the turn-on and turn-off times of the pull-down transistors Q2 and Q4 can be speeded up by adjustment of the ECL gate voltage levels. Similarly, since the gate electrodes of the transistors N1 and N2 are controlled by the ECL input levels, the turn-on and turn-off times of the pull-up transistors Q1 and Q3 can be speeded up in like fashion. The current source transistors N3 and N4 serve to limit the amount of pull-down current at the respective nodes 1 and 2. The pull-down current is substantially constant with a desired temperature coefficient and is independent of variations in the power supply voltage and process corners.

From the foregoing detailed description, it can thus be seen that the present invention provides a bipolar/-CMOS ECL-to-CMOS conversion circuit for receiving ECL differential input signals and for converting the ECL input signals to CMOS complementary output signals. The conversion circuit of the present invention has high current drive capabilities and low propagation delay regardless of variations in ambient temperature conditions and process corners.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A bipolar/CMOS ECL-to-CMOS conversion circuit for receiving ECL differential input signals and for converting said ECL input signals to CMOS complementary output signals, comprising:

first output stage formed of a first bipolar transistor (Q1) and a second bipolar transistor (Q2), said first bipolar transistor (Q1) having its collector connected to an upper supply potential and its emitter connected to the collector of said second bipolar transistor (Q2), said second bipolar transistor (Q2) having its collector connected also to a first output terminal (18) for generating one of said CMOS complementary output signals and its emitter connected to a lower supply potential;

second output stage formed of a third bipolar transistor (Q3) and a fourth bipolar transistor (Q4), said third bipolar transistor (Q3) having its collector connected to the upper supply potential and its emitter connected to the collector of said fourth bipolar transistor (Q4), said fourth bipolar transistor (Q4) having its collector connected also to a second output terminal (16) for generating the other one of said CMOS complementary output signal and its emitter connected to the lower supply potential;

first base drive circuit means (24) being responsive to one of said ECL differential input signals for generating a first control signal connected to the base of said first bipolar transistor (Q1);

second base drive circuit means (26) being responsive to the other one of said ECL differential input signals for generating a second control signal connected to the base of said third bipolar transistor (Q3);

third base drive circuit means (28) being responsive to said second control signal and the other one of said ECL differential input signals for generating a third control signal connected to the base of said second bipolar transistor (Q2);

fourth base drive circuit means (30) being responsive to said first control signal and said one of said ECL differential input signals for generating a fourth control signal connected to the base of said fourth bipolar transistor (Q4);

said first base drive circuit means (24) including a first P-channel MOS transistor (P1) and a first N-channel MOS transistor (N1), said first P-channel MOS transistor (P1) having its source connected to the upper supply potential, its gate connected to the gate of said first N-channel transistor (N1), and its drain connected to the drain of said first N-channel transistor (N1), the common gates of said first P-channel and first N-channel transistors (P1, N1) being connected to a first input terminal (12) for receiving said one of said ECL differential input signals, the common drains of said first P-channel and first N-channel transistors (P1, N1) being connected to the base of said first bipolar transistor (Q1);

said second base drive circuit means (26) including a second P-channel MOS transistor (P2) and a second N-channel MOS transistor (N2), said second P-channel transistor (P2) having its source connected to the upper supply potential, its gate connected to the gate of said second N-channel transistor (N2), and its drain connected to the drain of said second N-channel transistor (N2), the common gates of said second P-channel and second N-channel transistors (P2, N2) being connected to a second input terminal (14) for receiving the other one of said ECL differential input signals, the common drains of said second P-channel and second N-channel transistors (P2, N2) being connected to the base of said third bipolar transistor (Q3); and said first base drive circuit means (24) further including a third N-channel MOS transistor (N3) functioning as a regulated current source, said third N-channel transistor (N3) having its drain connected to the source of said first N-channel transistor (N1), its gate connected to a CMOS gate-controlling voltage, and its source connected to the lower supply potential.

2. A conversion circuit as claimed in claim 1, wherein said second base drive circuit (26) further comprises a fourth N-channel MOS transistor (N4) functioning as a regulated current source, said fourth N-channel transistor (N4) having its drain connected to the source of said second N-channel transistor (N2), its gate connected to the CMOS gate-controlling voltage, and its source connected to the lower supply potential.

3. A conversion circuit as claimed in claim 2, wherein said third base drive circuit means (28) comprieses fifth and sixth N-channel MOS transistors (N5, N7), said fifth N-channel transistor (N5) having its drain connected to the collector of the second bipolar transistor (Q2), its gate connected to the base of the third bipolar transistor (Q3), and its source connected to the base of the second bipolar transistor (Q2), said sixth N-channel transistor (N7) having its drain connected also to the base of the second bipolar transistor (Q2), its gate connected to the second input terminal (14) and its source connected to the lower supply potential.

4. A conversion circuit as claimed in claim 3, wherein said fourth base drive circuit means (30) comprises seventh and eighth N-channel MOS transistors (N6, N8), said seventh N-channel transistor (N6) having its drain connected to the collector of the fourth bipolar transistor (Q2), its gate connected to the base of said first bipolar transistor (Q1), and its source connected to the base of said fourth bipolar transistor (Q4), said eighth N-channel transistor having its drain connected also to the base of the fourth bipolar transistor (Q4), its gate connected to the first input terminal (12), and its source connected to the lower supply potential.

5. A conversion circuit as claimed in claim 1, wherein said first through fourth bipolar transistors (Q1-Q4) are of the NPN-type conductivity.

6. A conversion circuit as claimed in claim 1, wherein said conversion circuit is formed on a single silicon chip of a monolithic integrated circuit.

7. A bipolar/CMOS ECL-to-CMOS conversion circuit for receiving ECL differential input signals and for converting said ECL input signals to CMOS complementary output signals, comprising:

an output stage formed of a first bipolar transistor (Q1) and a second bipolar transistor (Q2), said first bipolar transistor (Q1) having its collector connected to an upper supply potential and its emitter connected to the collector of said second bipolar transistor (Q2), said second bipolar transistor (Q2) having its collector connected also to a first output terminal (18) for generating one of said CMOS complementary output signals and its emitter connected to a lower supply potential;

first base drive circuit means (24) being responsive to one of said ECL differential input signals for generating a first control signal connected to the base of said first bipolar transistor (Q1);

second base drive circuit means (28) being responsive to the other one of said ECL differential input signals for generating a second control signal connected to the base of said second bipolar transistor (Q2);

said first base drive circuit means (24) including a first P-channel MOS transistor (P1) and a first N-channel MOS transistor (N1), said first P-channel MOS transistor (P1) having its source connected to the upper supply potential, its gate connected to the gate of said first N-channel transistor (N1), and its drain connected to the drain of said first N-channel transistor (N1), the common gates of said first P-channel and first N-channel transistors (P1, N1) being connected to a first input terminal (12) for receiving said one of said ECL differential input signals, the common drains of said first P-channel and first N-channel transistors (P1, N1) being connected to the base of said first bipolar transistor (Q1); and said first base drive circuit means (24) further including a second N-channel MOS transistor (N3) functioning as a regulated current source, said second N-channel transistor (N3) having its drain connected to the source of said first N-channel transistor (N1), its gate connected to a CMOS reference voltage, and its source connected to the lower supply potential.

8. A conversion circuit as claimed in claim 7, wherein said second base drive circuit means (28) comprises third and fourth N-channel MOS transistors (N5, N7), said third N-channel transistor (N5) having its drain connected to the collector of the second bipolar transistor (Q2), its gate connected to the base of a third bipolar transistor (Q3), and its source connected to the base of the second bipolar transistor (Q2), said fourth N-channel transistor (N7) having its drain connected also to the base of the second bipolar transistor (Q2), its gate connected to a second input terminal (14) and its source connected to the lower supply potential.

9. A conversion circuit as claimed in claim 7, wherein said first and second bipolar transistors (Q1-Q2) are of the NPN-type conductivity.

10. A conversion circuit as claimed in claim 7, wherein said conversion circuit is formed on a single silicon chip of a monolithic integrated circuit.

* * * * *